United States Patent [19]
Lee et al.

[11] Patent Number: 5,869,881
[45] Date of Patent: Feb. 9, 1999

[54] PILLAR BIPOLAR TRANSISTOR

[75] Inventors: Kyu-Hong Lee; Jin-Hyo Lee, both of Daejeon, Rep. of Korea

[73] Assignee: Electronics and Telecommunications Research Institute, Daejeon, Rep. of Korea

[21] Appl. No.: 946,009

[22] Filed: Oct. 7, 1997

Related U.S. Application Data

[63] Continuation of Ser. No. 577,391, Dec. 22, 1995, abandoned, which is a continuation of Ser. No. 360,137, Dec. 20, 1994, abandoned.

[51] Int. Cl.$^6$ .................... H01L 27/082; H01L 27/102; H01L 29/70; H01L 31/11
[52] U.S. Cl. .................................. 257/586; 257/565
[58] Field of Search ..................... 257/586, 565

[56] References Cited

U.S. PATENT DOCUMENTS

| | | | |
|---|---|---|---|
| 4,969,026 | 11/1990 | Van der Velder | 357/34 |
| 5,409,845 | 4/1995 | Robinson et al. | 437/31 |

Primary Examiner—Stephen D. Meier
Attorney, Agent, or Firm—Jacobson, Price, Holman & Stern, PLLC

[57] ABSTRACT

The present invention relates to a pillar bipolar transistor and the fabricating method thereof, the active region on which the emitter region, the base region and the collector region are formed, is defined at the first pillar by the trench formed in the semiconductor substrate, a party of the base region and the polysilicon base electrode is electrically connected by the base connection, thereby decreasing the contact area and protecting to increase the extrinsic region of the base, and protecting to mask a juction of base to emitter at high concentration. Also, the polysilicon emitter electrode having the wide surface area is formed by self-aligned contact using the CMP method on the upper of the emitter region. Therefore, the active region of the transistor is defined in the first pillar, so that the parasitic capacitance between the emitter and the collector, and the base is decreased, and the contact area between the base region and the polysilicon base electrode is also decreased, thereby enhancing the operational characteristic of the transistor by protecting to increase the extrinsic region of the base, and the current gain similar to the forward operation of the transistor can be obtained in the backward operation of the transistor. Also, the emitter polysilicon electrode having the wide surface is self-arranged with the emitter region, thereby easily forming the contact opening to form the emitter electrode.

10 Claims, 5 Drawing Sheets

PILLAR BIPOLAR TRANSISTOR

This is a continuation of Ser. No. 08/577,391, filed on Dec. 22, 1995, abandoned, which is a continuation-in-part of Ser. No. 08/360,137, filed Dec. 20, 1994, abandoned.

FIELD OF INVENTION

The present invention relates to a bipolar transistor, and more particularly to the integration of the pillar bipolar transistor which has the bidirectional operation characteristics, the lower parasitic capacitance of the base, emitter and collector electrodes.

BACKGROUND OF THE INVENTION

Recently, the bipolar transistor is required of the lower power consumption, the lower parasitic capacitance, and the lower parasitic resistance.

FIG. 1 is the sectional view of the bipolar transistor in accordance with the conventional technique.

Referring to FIG. 1, the P-type semiconductor substrate is denoted as the reference number 1, the $N^+$-type buried region is denoted as the reference number 2, the N-type collector region is denoted as the reference number 3, the $N^+$-type sink region is denoted as the reference number 4, the P-type base region is denoted as the reference number 7, the $N^+$-type emitter region is denoted as the reference number 8, the dielectric films are denoted as the reference numbers 5, 6 and 10, respectively, and the metal electrodes are denoted as the reference number 9.

It is the metal electrodes to connect the emitter electrode, the base electrode, and the collector electrode to an emitter region 8, the base region 7, and the sink region 4, respectively.

The dielectric film 5 as described hereinabove is filled in the trench which is formed by a predetermined depth into the semiconductor substrate, and is separated or isolated between the elements, thereby reducing the size of elements as well as the junction area of the semiconductor substrate 1 and the buried region 2, and the parasitic connecting capacitance.

However, the bipolar transistor as described hereinabove has a problem that the power consumption of the bipolar transistor is high by increasing the parasitic capacitance because the base region is widely connected to the emitter region of a high concentration, and the extrinsic base area is large.

FIG. 2 is the sectional view of the bipolar transistor fabricated by the conventional sidewall base contact method. It is described in U.S. patent application Ser. No. 443,554.

Referring now to FIG. 2, the reference numeral 13 denotes the N-type collector region, the reference numeral 17 denotes the base region, and the reference numeral 18 denotes $N^+$-type emitter region.

These regions 13, 17 and 18 as described hereinabove are the active regions of elements in which is provided on the piller 100 of a cylindrical type formed by the etching of the P-type semiconductor substrate 11. The reference numeral 12 denotes the $N^+$-type buried region formed in the semiconductor substrate, the reference numeral 15 denotes the $N^+$-type sink in which provided on the pillar 101 of another cylindrical type formed on the semiconductor substrate 11.

The dielectric film 16 is deposited on the pillars 100 and 101 overlaid on the etched semiconductor substrate 11, and the polysilicon base electrode 14 is formed, which is contacted to the side of base electrode 17 overlaid on the dielectric film 16.

Also, the reference numerals 98 and 99 denotes the dielectric films respectively, the reference numeral 20 denotes the electrode which can be used to the emitter electrode, the base electrode and the collector electrode, each of which is electrically connected to the emitter region 18, the polysilicon base electrode 14 and the sink 15.

The emitter region 18 and the collector region 13 of the bipolar transistor are narrowly jointed to the base region 17, and thus the backward characteristics is also enhanced.

When the bipolar transistor is backwardly operated as mentioned hereinabove, the emitter region 18 is operational as the collector region, and the collector region 13 is operational as the emitter region in the forward operation, respectively.

However, the conventional bipolar transistor as mentioned hereinabove has the larger contact surface in which the base region is contacted by the thickness of the polysilicon base electrode, and thus the operational characteristics of the transistor is down because the contact surface is wide, and the extrinsic region of the base is increased, and there is a problem that the power consumption of it is increased by the parasitic capacitance between the emitter region and the collector region, and the polysilicon base electrode.

The method for forming the constant high of the dielectric film and the base polysilicon electrode over the entire region except for the pillar is also a difficult problem.

It is also the difficult problem to form the emitter electrode over the emitter region because the emitter region is formed on the upper of the pillar of the small size without self-contact.

SUMMARY OF THE INVENTION

Therefore, it is the object of the present invention to provide a pillar bipolar transistor which can reduce the contact surface between the base region and the base electrode, and enhance the bi-directional operational characteristics of the transistor.

It is another object of the invention to provide a pillar bipolar transistor which can reduce the parasitic capacitance between the emitter and collector regions, and the base region.

A method is disclosed for fabricating a pillar bipolar transistor in accordance with the present invention which can form a trench only around a part of the pillar so that the step of forming the polysilicon base electrode around the pillar can be easily done and the base polysilicon electrode can be easily buried in the trench by a chemical mechanical polishing(CMP) technique.

It is a further object of the present invention to provide the pillar bipolar transistor which has the similar current gain in bidirectional operation according to the forward operation and the backward operation.

It is a still further object of the invention to provide a pillar bipolar transistor in which the emitter electrode can be easily aligned during manufacturing by the self-aligned contact open technique.

A pillar bipolar transistor according to the present invention for accomplishing objects as mentioned hereinabove comprises a trench of a certain depth defining the elements region, a first conductivity semiconductor substrate having a first and second pillars in the trench; a second conductivity impurity diffusion region of a high concentration formed at the lower around of the first pillar and the entire region of the second piller in the semiconductor substrate trench; a second conductivity emitter region of a high concentration formed on the upper of the first pillar; a first conductivity base region formed at the middle between the impurity diffusion region and the emitter region of the first pillar; a second conductivity sink of a high concentration which is the impurity diffusion region formed at the second pillar; a first conductivity polysilicon base electrode which is buried lower a certain depth than the surface of pillar in the trench; a first dielectric oxide film formed in the trench to electrically isolate the polysilicon base electrode and the semiconductor substrate; a first conductivity base connection formed to be partly connected between the base region and the polysilicon base electrode; a second conductivity polysilicon emitter electrode of a high concentration formed to be self-aligned the emitter region; a second dielectric oxide film which the polysilicon base electrode is protectable to electrically connect the polysilicon emitter electrode; an emitter metal electrode, a base metal electrode and a collector metal electrode formed over the upper of the polysilicon emitter electrode, the polysilicon base electrode and the sink.

A method for fabricating such a pillar bipolar transistor for accomplishing the objects as mentioned hereinabove comprises the step of etching a trench to form the first and second pillar defining the element region in the first conductivity silicon substrate; the step of forming a high concentration of the second conductivity impurity diffusion region and the sink in the region around the lower of the first pillar and the second pillar; the step of buring polysilicon in the inner of the trench which the polysilicon is polished by CMP(chemical-mechanical polish) after the deposition of the first dielectric oxide film and the first conductivity polysilicon layer over the entire surface of the semiconductor substrate; the step of defining the polysilicon base electrode by etching the polysilicon layer to be a certain depth of the trenchs' inner; the step of etching a certain depth of the first dielectric oxide film formed around the first exposed pillar, and forming the base connection by filling the first conductivity polysilicon at the etched portion; the step of planarization to the polysilicon at the entire surface of the semiconductor substrate by CMP using the second dielectric oxide film as the polishing stopper; the step of self-aligned emitter contact exposing the surface of the first pillar to selectively remove the second oxide film of the upper of the first pillar; the step of forming the first conductivity base region and the second conductivity emitter region connected to the base connection by ion implanting and heating subsequentially the first conductivity impurity and the second impurity at the first exposed pillar; the step of forming the second self-aligned conductivity polysilicon emitter electrode which has the surface wider than the surface of the emitter region formed on the upper of the emitter region; and the step of forming a electrode and an opening so that the polysilicon base electrode, the polysilicon emitter electrode and the sink are exposed after the protected film is formed on the upper of the second dielectric oxide film and the polysilicon emitter electrode.

BRIEF DESCRIPTION OF THE DRAWINGS

Further features and advantages will become more apparent from the following and a more particular description of the preferred embodiment of the invention, as illustrated in the accompanying drawings in which the reference numerals is generally referred to the same elements, area or regions through the views, and in which.

DETAILED DESCRIPTION OF THE INVENTION

Figure 1:
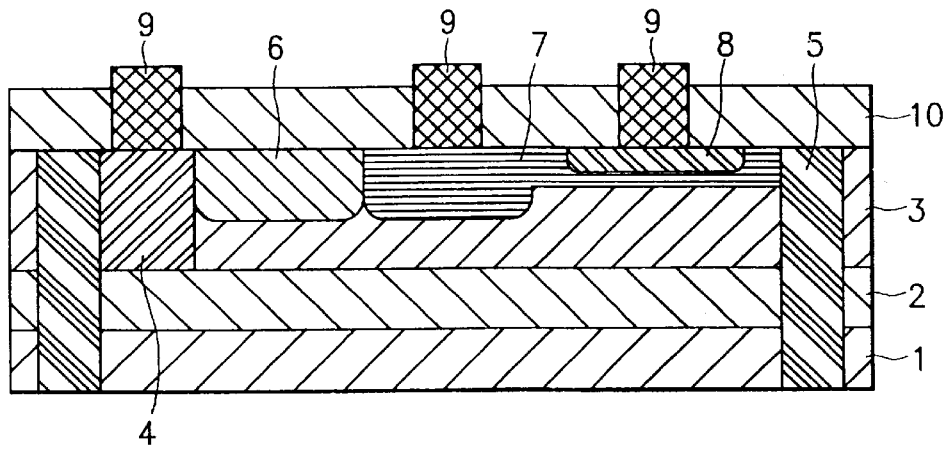
FIG. 1 is the sectional view of the bipolar transistor according to the conventional technique.
Figure 2:
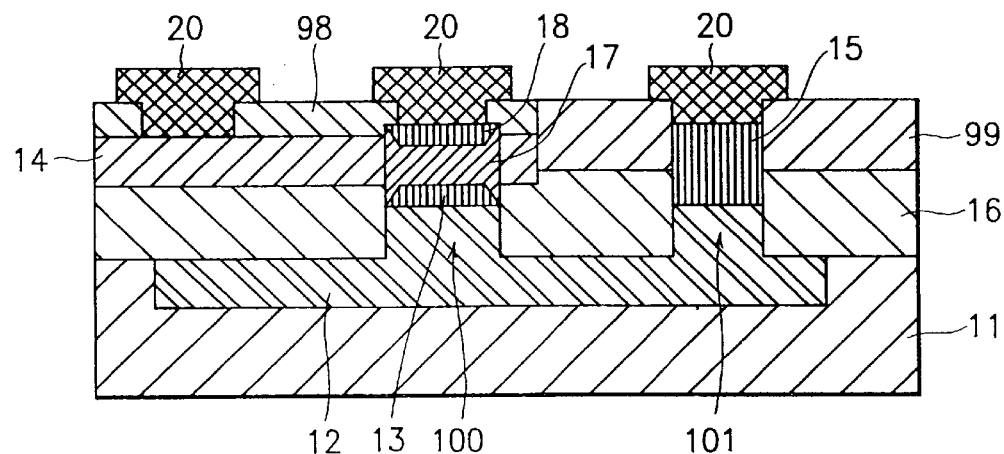
FIG. 2 is the sectional view of the bipolar transistor fabricated by the conventional sidewall base contact method.
Figure 3:
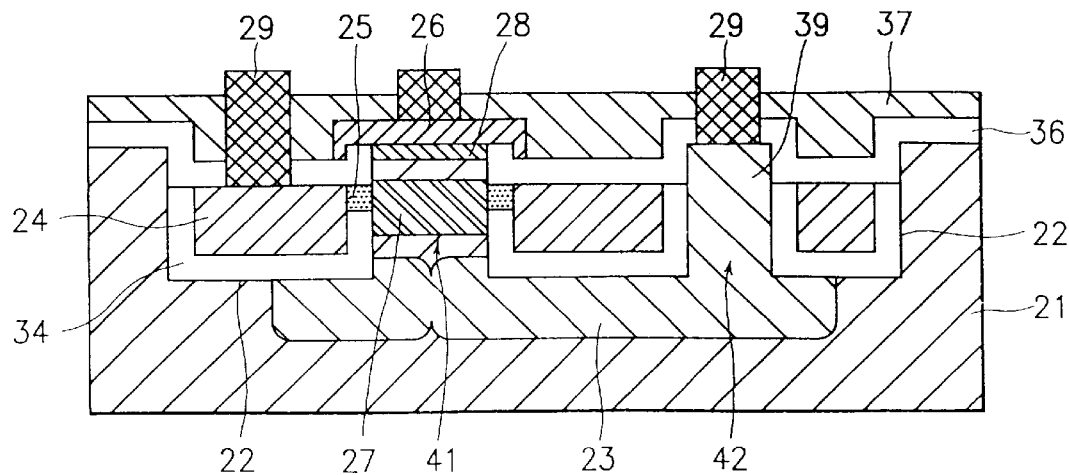
FIG. 3 is the sectional view of the pillar bipolar transistor according to the present invention.

FIG. 3 is the sectional view of the pillar bipolar transistor according to the present invention.

The bipolar transistor comprises the trench 22 defining the element region at a certain portion of the P-type semiconductor substrate 21, and the first and second pillars 41 and 42 formed in the inner of the trench 22.

The first and second pillars have the size of the diameter of 0.3~2 $\mu$m, and the high of 0.7~2 $\mu$m, and the $N^+$-type impurity diffusion region 23 in which is doped by a high concentration of $1 \times 10^{20}$~$1 \times 10^{21}$/cm$^3$ of N-type impurity comprising phosphorus(P) or arsenic(As).

The $N^+$-type emitter region 28 in which is doped by a high concentration of $1 \times 10^{20}$~$1 \times 10^{21}$/cm$^3$ of the N-type impurity, is formed on the upper of the first pillar 41, and the P-type base region 27 in which is doped by the $5 \times 10^{16}$~$1 \times 10^{19}$/Cm$^3$ of the P-type impurity comprising boron(B) and etc. is formed in the middle between the impurity diffusion region 23 and the emitter region 28.

Thus, the active region of the element is defined at the first pillar 41.

The $N^+$-type sink 39 in which is doped by $1 \times 10^{20}$~$1 \times 10^{21}$/Cm$^3$ of the N-type impurity to electrically connect the impurity diffusion region 23 is also formed at all the second pillar 42.

The trench 22 is filled by the first dielectric oxide film 34 and the P-type polysilicon base electrode 24 to fill a predetermined height into the inner thereof.

The first dielectric oxide film 34 has the thickness of 1500~2500 Angstrom, and is removed to be lower height than the polysilicon base electrode formed in the side of the first pillar 41.

The P-type base connection 25 which is doped by $1 \times 10^{18}$~$1 \times 10^{19}$/cm$^3$ of the P-type impurity is formed between the base region 27 and the polysilicon base electrode 24.

The upper of the base connection 25 is formed to be lower height than the upper of the base region 27 to electrically connect between the base region 27 and the polysilicon base electrode 24.

Therefore, the polysilicon base electrode 24 is electrically isolated by the impurity diffusion region 23 and the sink 39 by the first oxide film 24, as well as electrically connected the base region 27 by only the base connection 25.

The N-type polysilicon emitter electrode 26 which has the thickness of 2000–4000 Angstrom, and which is doped by $1 \times 10^{20}$~$1 \times 10^{21}$/cm$^3$ of the N-type impurity is formed by self-aligned contact over the upper of the emitter region 28.

The metal electrode 29 which can be used to the emitter electrode, the base electrode and the collector electrode is formed on the upper of the polysilicon emitter electrode 26, the polysilicon base electrode 24 and the sink 39.

In FIG. 3, the reference numerals 34, 36 and 37 denote the first, second and third dielectric oxide film, and more particularly the second dielectric oxide film 36 is protected by electrically connecting with the polysilicon emitter electrode 26, and the polysilicon base electrode 24.

The bipolar transistor as mentioned hereinabove can make small the junction area of the impurity diffusion region 23 and the base region 27 by using the first pillar 41 as the active region.

Therefore, it is to reduce the parasitic capacitance between the emitter and the collector, and the base.

Both the base region 27 and the polysilicon base electrode 24 are electrically connected by the base connection 25, thereby decreasing the contact region, increasing the extrinsic region of the base and enhancing the bidirectional current gain of the transistor, and the emitter region of a high concentration which is used to the collector region in the backward operation of the transistor is not also formed at a junction to the base region at high concentration, and can be obtained by the current gain similar to the forward operation in the backward operation because the junction area of base to collector is the same as that of base to emitter.

Also, the bipolar transistor as mentioned hereinabove illustrates which one of the first and the second pillars is formed once from each other in the inner of the trench defining the element region, but the multiple of the first pillars can be formed.

FIGS. 4(A) to 4(K) illustrate the process for fabricating the pillar bipolar transistor according to the present invention.

Figure 4A:
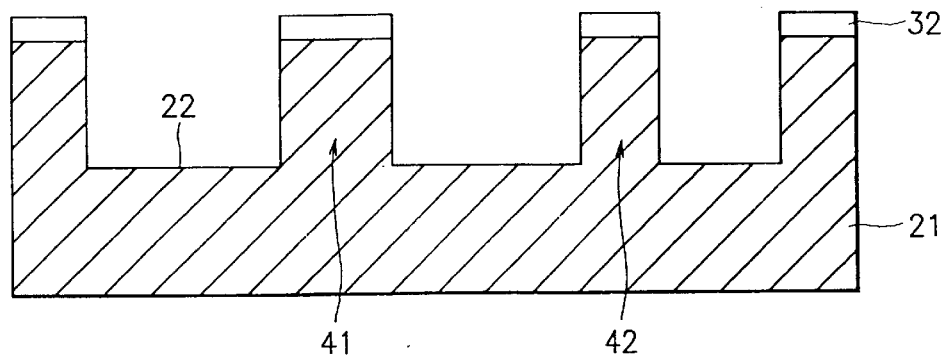
FIGS. 4(A)–4(K) illustrate the process for fabricating the transistor as shown in FIG. 3.

Referring to FIG. 4(A), the oxide film 32 is removed by exposing a certain portion of the semiconductor substrate by photo lithography process after the oxide film 32 of the thickness of 4000~6000 Angstrom is formed on the semiconductor substrate of the P-type silicon by the chemical vapor deposition (CVD) method.

The trench 22 of the depth of 0.7~2 gem is formed by anisotropic etching the exposed portion of the semiconductor substrate 21 using the oxide film 32 as the etching mask with the dry etching method comprising the reactive ion etching (RIE) method and etc.

As mentioned hereinabove, in forming the trench 22, the first and the second pillars 41 and 42 having the diameter of 0.3~2 $\mu$m is formed.

A unit element is comprised with the second pillar 42 and multiple first pillar 41, or by only multiple first pillar 41 in the trench 22.

Figure 4B:
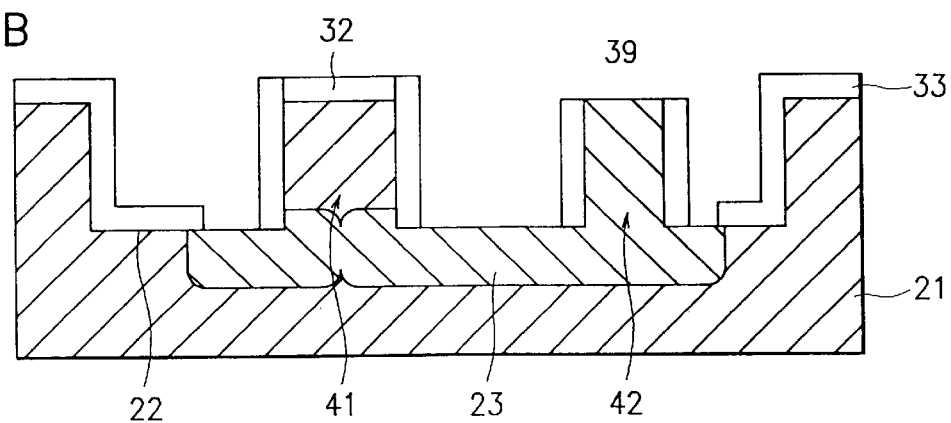

Referring to FIG. 4(B), the oxide film 33, of which thickness is 1500~3000 Angstrom, is deposited by the CVD method over the semiconductor substrate which the oxide film 32 is removed except for that formed on the upper of the first pillar 41.

Then, the oxide film 33 is also formed on the upper of the oxide film 32 of the pillar 41.

The exposed oxide film 33 is removed by the RIE method using the photo mask(not shown).

Then, the oxide film 33 formed at the side of the first and second pillars 41 and 42 is not removed, and the oxide film 32 on the upper of the first pillar 41 is not also removed.

Also, the N$^+$-type impurity diffusion region 23 and the N$^+$-type sink are formed on the area of the removed oxide films 32 and 33, and doping a high concentration of $1\times10^{20} \sim 1\times20^{30}/cm^3$ of the N-type impurity comprising the phosphorus(P) or arsenic(As) or etc.

Figure 4C:
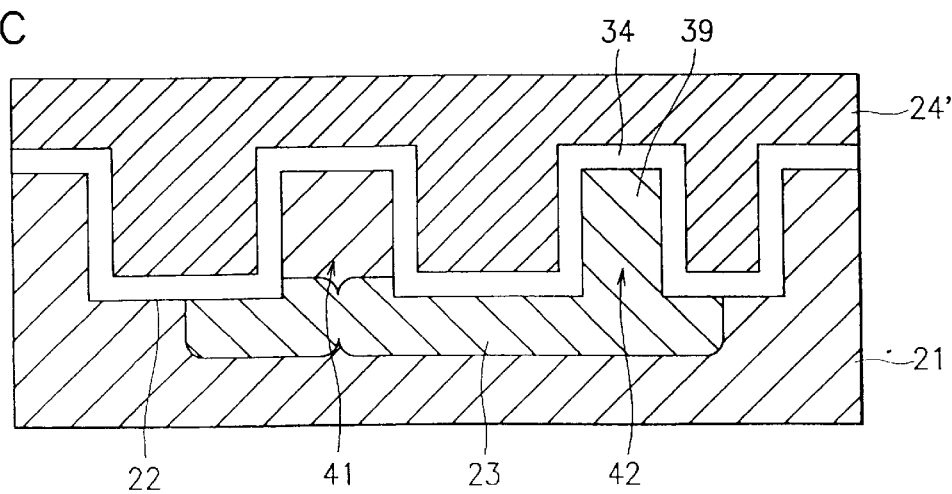

Referring to FIG. 4(C), the first dielectric oxide film 34 having the thickness of 1500~2500 Angstrom is formed by the CVD method over the entire surface of the semiconductor substrate 21 after the oxide films 32 and 33 are removed.

Also, the polysilicon layer 24' of which thickness is 1.5~2.5 $\mu$m, doped by $5\times10^{18} \sim 5\times10^{20}/cm^3$ of the P-type impurity comprising boron and etc. by the CVD method is deposited on the upper of the first dielectric oxide film 34.

Figure 4D:
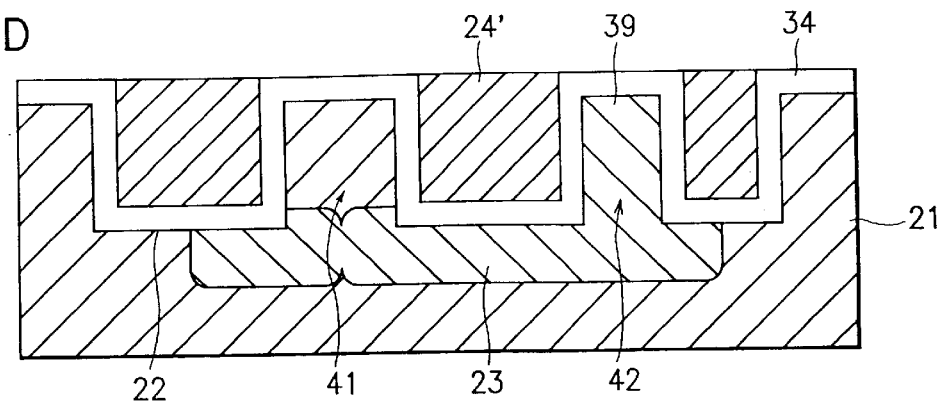

Referring to FIG. 4(D), the polysilicon layer 24' is polished by performing the chemical mechanical polishing (CMP) method to expose the first dielectric oxide film 34. The buried polysilicon remains in the inner of the trench 22.

Then, the first dielectric oxide film 34 is used to the polishing stopper.

Figure 4E:
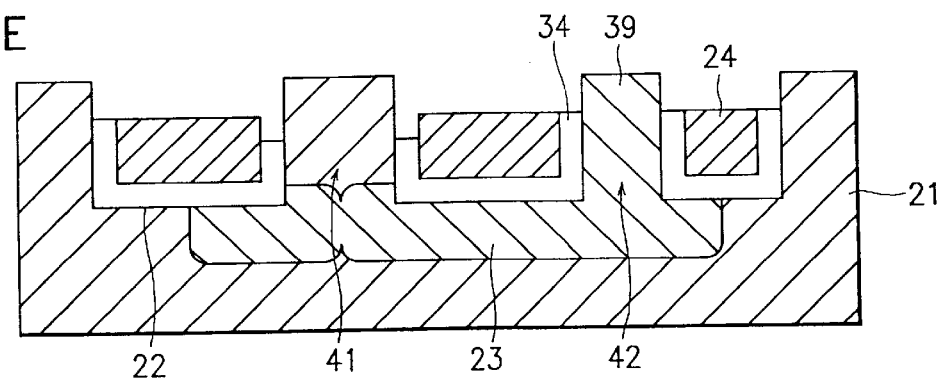
Figure 4F:
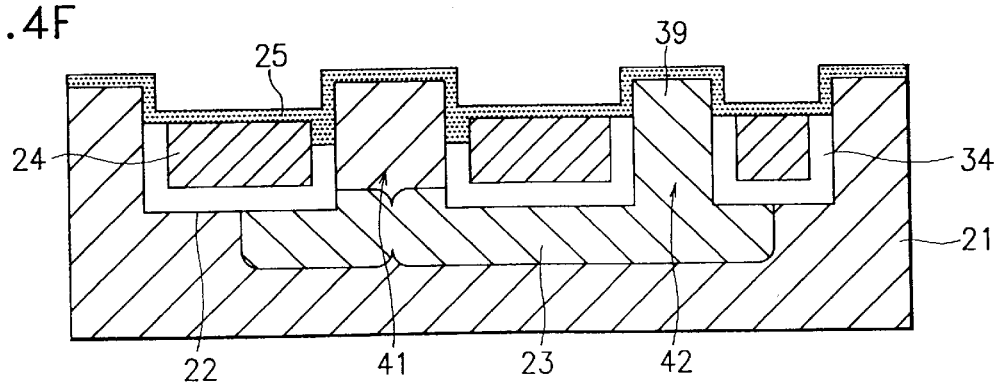

Referring to FIG. 4(E), the dielectric oxide film 34 is etched by the thickness of the first dielectric oxide film 34 after the buried polysilicon layer 24' is etched by 3000~5000 Angstrom by the RIE method.

Also, the only sidewall oxide of the first pillar 41 is etched by 1000~3000 Angstrom by using the photo mask(not shown).

There is the polysilicon base electrode 24 in the trench in condition of unpolishing of the polysilicon layer 24' as mentioned hereinabove.

Referring to 4(F), the polysilicon 25 is deposited to refill the area of the etched sidewall oxide of pillar 41.

The upper surface of the base connection 25 as mentioned hereinabove is removed by isotrophic dry etching.

Figure 4G:
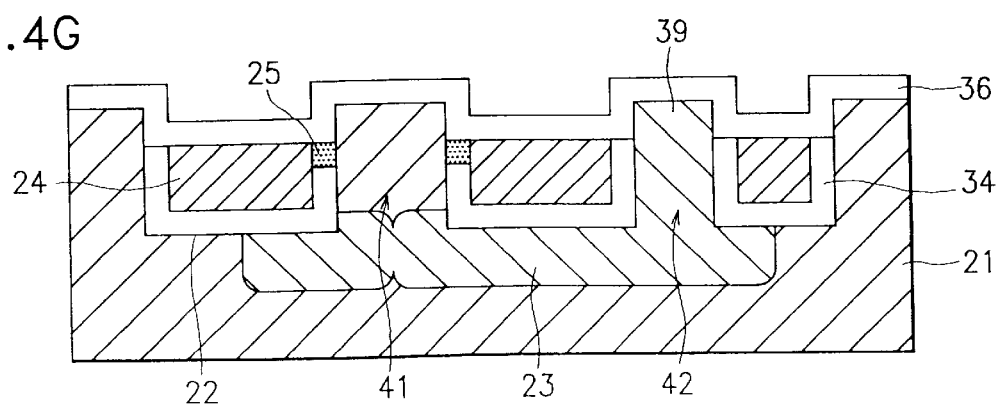

Referring to FIG. 4(G), the second dielectric oxide film 36 having the thickness of 1500~2500 Angstrom is formed by the CVD method or thermal oxidation at the entire surface of the above configuration.

Figure 4H:
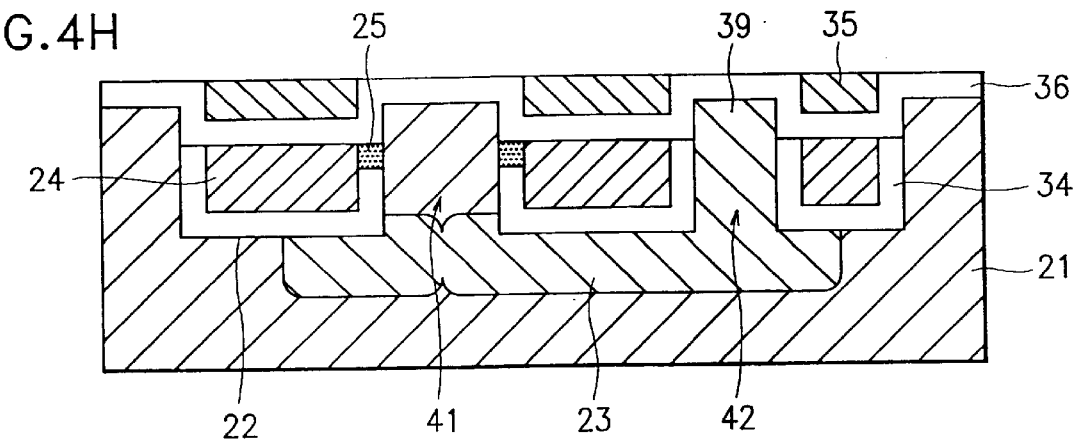

Referring to FIG. 4(H), the polysilicon layer 35 using the second oxide film 36 as the polishing stopper is polished by the CMP method after the polysilicon layer 35 is deposited on the entire surface of the second dielectric oxide film 36 by the CVD method.

Figure 4I:
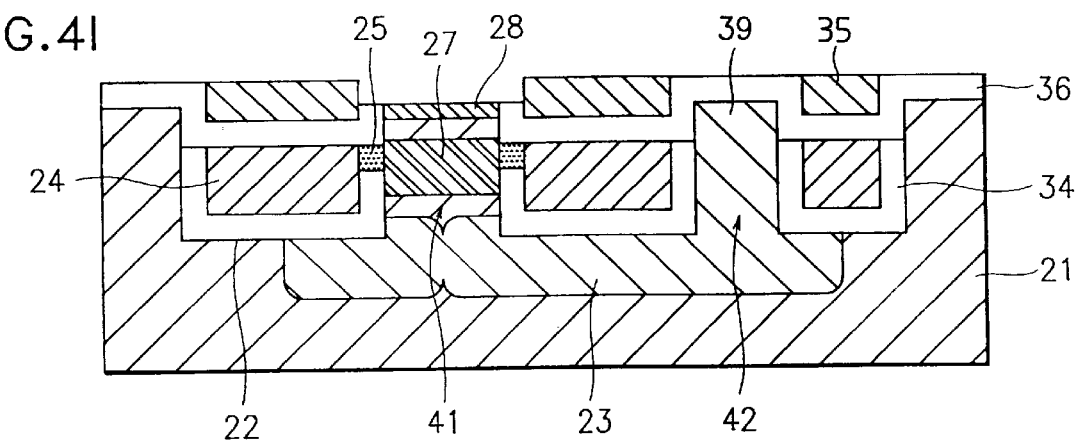

Referring to FIG. 4(I), the only second dielectric film 36 of the upper of the first pillar 41 is removed by the selective etching method by using the photo mask(not shown).

Also, the P-type base region 27 which is doped by $5\times10^{16} \sim 5\times10^{18}/cm^3$ of the P-type impurity and the N$^+$-type emitter region 28 which is doped by $1\times10^{20} \sim 1\times10^{21}/cm^3$ of the N-type impurity are formed by ion implanting at the first pillar 41.

The base region 27 as mentioned hereinabove is formed at the middle between the impurity diffusion region 23 and the emitter region 28, so that the junction of base to emitter and base to collector must not be made in the high concentration.

Figure 4J:
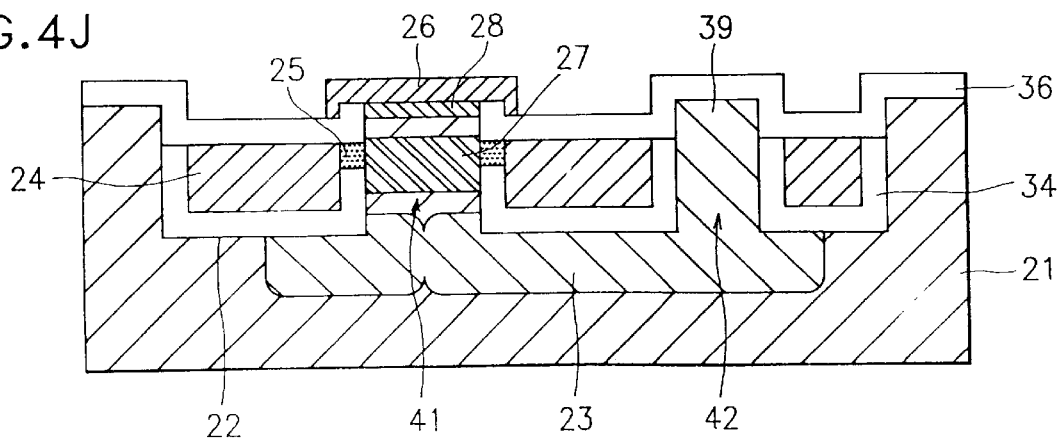

Referring to FIG. 4(J), the polysilicon 26 is deposited to be contacted with the emitter region 28. The polysilicon has the thickness of 2000~4000 Angstrom which is doped by $1\times10^{20} \sim 1\times10^{21}/cm^3$ of the N-type impurity over the entire surface of the configuration as mentioned hereinabove.

Then, the polysilicon layer is patterning, thereby forming the polysilicon emitter electrode 26 having the area wider than the area of the emitter region 28.

Figure 4K:
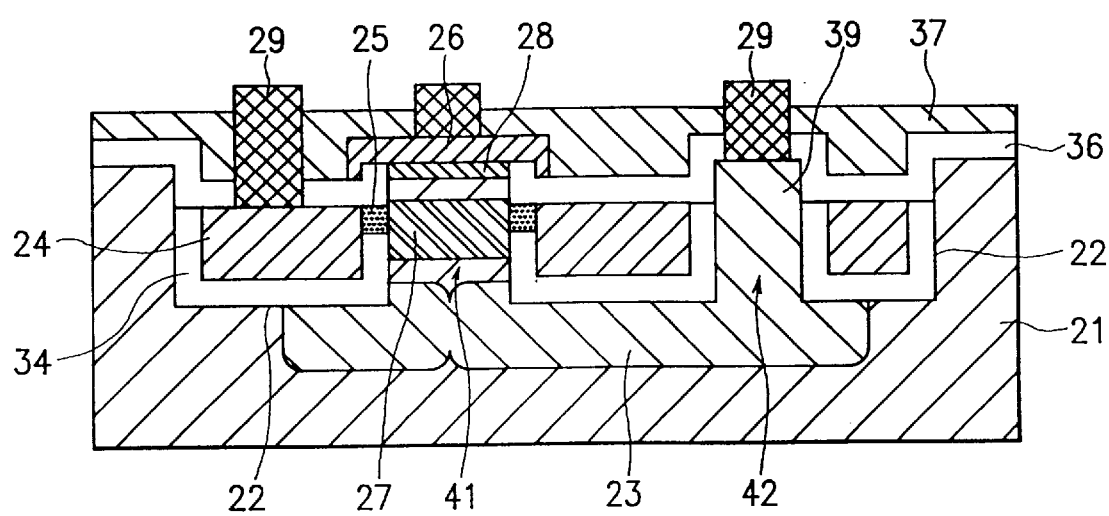

Referring to FIG. 4(K), the oxide film 37 having the thickness of 5000~7000 Angstrom is formed on the upper of the second dielectric oxide film 34 and the polysilicon emitter electrode 26.

Also, the metal electrode 29 which can be used to the base electrode, the emitter electrode and the collector electrode are formed after the upper of the polysilicon base electrode 24, the polysilicon emitter electrode 26 and the sink region 39 are exposed.

The contact opening to the metal electrode 29 is easily formed because the surface area of the polysilicon emitter electrode 26 is wide.

As mentioned hereinabove, the bipolar transistor and the fabrication method thereof according to the present invention is which the active region for forming the emitter region, the base region and the collector region the first and second pillars are defined by the trench are defined as the first pillar, the smaller portion of the base region and the polysilicon base electrode are electrically connected by the base connection.

Also, the polysilicon emitter electrode is formed after the self-aligned emitter contact is opened by the CMP method.

Therefore, the present invention has the advantages that the active region of the transistor is defined as the first pillar, so that the parasitic capacitance between the emitter and collector, and the base can be reduced, the contact area between the base region and the polysilicon base electrode is decreased, thereby protecting the extrinsic region of the base to increase, and enhancing the operational characteristic of the transistor, and the current gain similar to the forward operation an be obtained in the backward operation.

Also, the polysilicon emitter electrode having the wide surface area is contacted to emitter region by self-aligned contact method, so that the contact opening to form the emitter metal electrode is easily formed.

While the foregoing discloses the preferred embodiment of the invention, it is to be understand that many changes in the detail may be made as a matter of engineering choices without departing from the spirit and scope of the invention as defined by the appended claims. Moreover, those skilled in the art may find that it is not necessary to adopt all of the various advantages and features of the present disclosure in order to realize the individual advantages disclosed herein.

What is claimed is:

1. A pillar bipolar transistor, comprising:
   a first conductivity semiconductor substrate;
   a plurality of trenches in said substrate, each trench having a bottom and a certain depth;
   first and second pillars between the trenches, each pillar having an upper end, a middle portion and a lower end;
   a second conductivity impurity diffusion region having a high concentration formed under the bottom of said each trench, under the lower end of the first pillar, and in the second pillar;
   a second conductivity emitter region of a high concentration formed on the upper end of said first pillar;
   a first conductivity base region formed at the middle portion of said first pillar between said impurity diffusion region of said first pillar and said emitter region;
   a second conductivity sink of a high concentration which is an impurity diffusion region formed in said second pillar;
   a first conductivity polysilicon base electrode which is buried in the trenches which are adjacent to the first pillar;
   a first dielectric oxide film formed under said polysilicon base electrode to electrically isolate said polysilicon base electrode and said semiconductor substrate;
   a first conductivity base connection for partly connecting said base region and said polysilicon base electrode;
   a second conductivity polysilicon emitter electrode of a high concentration formed to be contacted to said emitter region by self-aligned method;
   a second dielectric oxide film for preventing said polysilicon base electrode from contacting with said polysilicon emitter electrode; and
   an emitter metal electrode, a base metal electrode and a collector metal electrode formed over the upper of said polysilicon emitter electrode, said polysilicon base electrode and said sink.

2. A pillar bipolar transistor as in claim 1, wherein said first and second pillars have the diameter of 0.3~2 $\mu$m and the depth of 0.7~1.5 $\mu$m.

3. A pillar bipolar transistor as in claim 1, wherein said first dielectric oxide film has a thickness of 1500~2500 Angstrom.

4. A pillar bipolar transistor as in claim 1, wherein said first dielectric oxide film is formed by 1000~3000 Angstrom to be the lower sidewall of the first pillar than the said polysilicon base electrode.

5. A pillar bipolar transistor as in claim 1, wherein said first pillar formed between the trenches is one or more.

6. A pillar bipolar transistor comprising:
   a semiconductor substrate of a first conductivity type having at least three trench regions, and first and second pillar structures formed between the trench regions;
   a collector region formed under the first and second pillar structures and in the second pillar structure, and doped with an impurity of a second conductivity type;
   an extrinsic base region buried in the trench regions;
   an oxide layer formed between the extrinsic base region and the substrate;
   an intrinsic base region of the first conductivity type formed at a center portion of the first pillar structure;
   a connecting portion formed between the extrinsic base region and the intrinsic base region to electrically connect the extrinsic base region with the intrinsic base region;
   an emitter region of the second conductivity type formed at an upper portion of the first pillar structure; and
   electrodes formed through contact holes on the emitter, collector and base regions.

7. A pillar bipolar transistor according to claim 6, further comprising a conductive thin film wider than the emitter so as to make formation of a contact hole easy.

8. A pillar bipolar transistor according to claim 7, wherein the conductive thin film is composed of polysilicon containing an impurity of the second conductivity type.

9. The pillar bipolar transistor according to claim 6, wherein the extrinsic base region is composed of polysilicon.

10. A pillar bipolar transistor comprising:
    a semiconductor substrate of a first conductivity type having at least three trench regions, and first and second pillar structures formed between the trench regions;
    an emitter region formed under the first and second pillar structures and in the second pillar structure, and doped with an impurity of a second conductivity type;
    an extrinsic base region buried in the trench regions;
    an oxide layer formed between the extrinsic base region and the substrate;
    an intrinsic base region of the first conductivity type formed at a center portion of the first pillar structure;
    a connecting portion formed between the extrinsic base region and the intrinsic base region to electrically connect the extrinsic base region with the intrinsic base region;
    a collector region of the second conductivity type formed at an upper portion of the first pillar structure; and
    electrodes formed through contact holes on the emitter, collector and base regions.

* * * * *